(12) United States Patent
Ahn

(10) Patent No.: US 12,322,526 B2
(45) Date of Patent: Jun. 3, 2025

(54) JUMPER CABLE DEVICE ASSEMBLY

(71) Applicant: Amosense Co., Ltd., Cheonan (KR)

(72) Inventor: Joo-Hwan Ahn, Cheonan (KR)

(73) Assignee: AMOSENSE CO., LTD., Cheonan-Si (KR)

( * ) Notice: Subject to any disclaimer, the term of this patent is extended or adjusted under 35 U.S.C. 154(b) by 695 days.

(21) Appl. No.: 17/601,115

(22) PCT Filed: Apr. 2, 2020

(86) PCT No.: PCT/KR2020/004504
§ 371 (c)(1),
(2) Date: Oct. 4, 2021

(87) PCT Pub. No.: WO2020/204623
PCT Pub. Date: Oct. 8, 2020

(65) Prior Publication Data
US 2022/0181049 A1 Jun. 9, 2022

(30) Foreign Application Priority Data
Apr. 3, 2019 (KR) .................. 10-2019-0038893

(51) Int. Cl.
*H01B 13/18* (2006.01)
*H01B 3/30* (2006.01)
(Continued)

(52) U.S. Cl.
CPC ............ *H01B 13/18* (2013.01); *H01B 3/306* (2013.01); *H01B 7/0208* (2013.01); *H01B 7/04* (2013.01)

(58) Field of Classification Search
CPC .......... H01B 13/18; H01B 3/30; H01B 3/306; H01B 3/44; H01B 7/02; H01B 7/0208
See application file for complete search history.

(56) References Cited

U.S. PATENT DOCUMENTS

| | | | | |
|---|---|---|---|---|
| 5,527,997 A | * | 6/1996 | Saen | ............ H01B 7/0018 |
| | | | | 174/268 |
| 6,581,276 B2 | | 6/2003 | Chung | |

(Continued)

FOREIGN PATENT DOCUMENTS

| | | |
|---|---|---|
| CN | 105594072 | 8/2018 |
| JP | 1994342679 | 12/1994 |

(Continued)

OTHER PUBLICATIONS

Search and Opinion from related PCT Application No. PCT/KR2020/004504, dated Jul. 8, 2020, 9 pages.

*Primary Examiner* — Minh N Trinh
(74) *Attorney, Agent, or Firm* — Brooks, Cameron & Huebsch, PLLC

(57) ABSTRACT

The present invention discloses a flexible cable jumper structure including a cover layer, a first metal layer stacked on the cover layer and having a circuit pattern formed thereon, a first dielectric layer stacked on the first metal layer, a first adhesive layer applied on the first dielectric layer, a second metal layer stacked on the first dielectric layer to which the first adhesive layer is applied and having a circuit pattern formed thereon, a heat resistant layer stacked on the second metal layer, and a terminal layer formed in one region of the heat resistant layer and electrically connected to the first metal layer and the second metal layer, and a flexible cable jumper device coupled to one side of the flexible cable jumper structure and including an RF connector including a plug having an electrode electrically connected to the terminal layer, and the flexible cable jumper device of the present invention has heat resistance and low loss characteristics by using a heat resistant material and a low dielectric constant material in a hybrid structure.

8 Claims, 10 Drawing Sheets

(51) Int. Cl.
  *H01B 7/02* (2006.01)
  *H01B 7/04* (2006.01)

(56) References Cited

U.S. PATENT DOCUMENTS

| | | | |
|---|---|---|---|
| 2010/0186995 A1 | 7/2010 | Yeh | |
| 2011/0139500 A1* | 6/2011 | Hara | H05K 3/361 |
| | | | 29/829 |
| 2022/0181049 A1* | 6/2022 | Ahn | H01B 7/0208 |

FOREIGN PATENT DOCUMENTS

| | | |
|---|---|---|
| JP | H0946012 | 2/1997 |
| JP | H11307197 | 11/1999 |
| JP | 5775753 B2 | 9/2015 |
| JP | 5900766 | 4/2016 |
| KR | 100752025 B1 | 8/2007 |
| KR | 20090001003 U | 2/2009 |
| KR | 20110005735 A | 1/2011 |
| KR | 20150077225 | 7/2015 |
| KR | 101664241 B1 | 10/2016 |
| KR | 20160122783 A | 10/2016 |
| KR | 20170077604 A | 7/2017 |
| KR | 20180024976 A | 3/2018 |
| KR | 20180025278 | 3/2018 |
| KR | 101912683 B1 | 10/2018 |

* cited by examiner

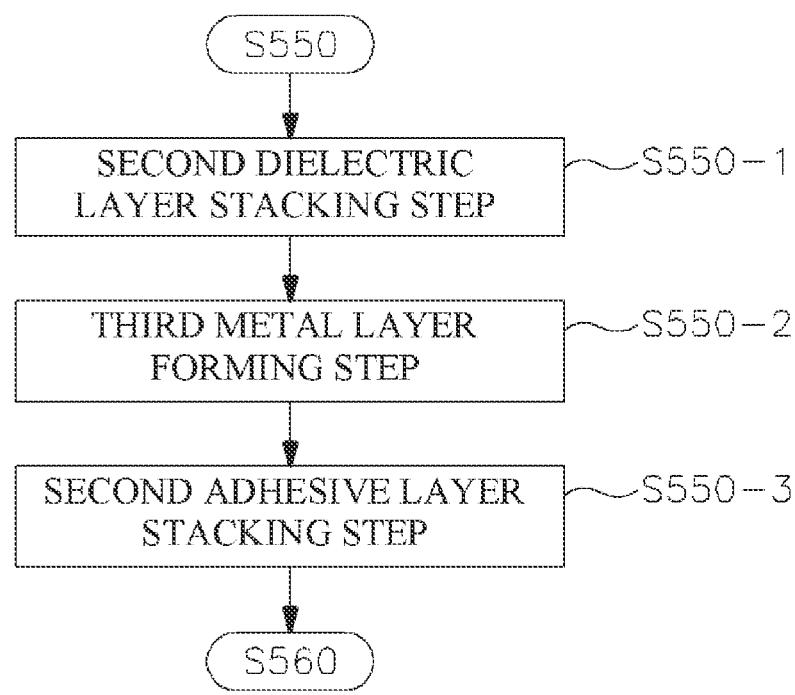
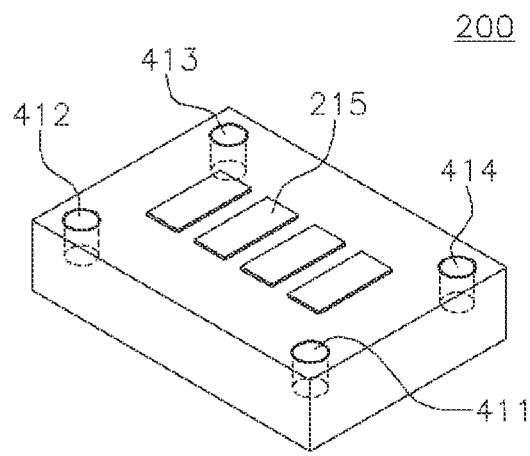

JUMPER CABLE DEVICE ASSEMBLY

TECHNICAL FIELD

The present invention relates to a flexible cable jumper device and a method for manufacturing the same, and more particularly, to a flexible cable jumper device capable of connecting a plug and a receptacle by magnetic force of a magnetic member, and having heat resistance, low dielectric constant and low loss characteristics and a method for manufacturing the same.

BACKGROUND ART

Conventional coaxial cables are thick, and there is a problem in that work process becomes cumbersome when assembling electronic products (e.g., mobile terminals). Therefore, there is a need for developing components to replace coaxial cables.

Accordingly, the adoption of a flexible jumper is required to replace such a coaxial cable. Flexible jumpers known to date require heat resistance to withstand a high-temperature process during manufacturing, and there is an attempt to use a polyimide (PI) resin as a cover layer to solve this problem.

Polyimide has excellent properties in terms of heat resistance that can withstand a process temperature of 240° C. to 260° C., but polyimide has a problem in that a signal interference phenomenon occurs because of its high dielectric constant.

Accordingly, there is a demand for the development of a new material having a low dielectric constant characteristic while maintaining heat resistance. In this situation, there are various material groups presented as low dielectric materials, and there is a need for developing a new type of flexible jumper structure that shows heat resistance and low dielectric constant characteristics by applying the characteristics of these material groups to the flexible jumper.

In addition, a flexible jumper is provided with a plug for electrical coupling with a board or other devices, and is coupled with a corresponding receptacle, but according to an existing coupling method, it is disadvantageous in terms of attachment and detachment, and there may be a problem that the loss factor of the board deteriorates.

DISCLOSURE

Technical Problem

The present invention is devised by the above-mentioned desires, and the object of the present invention is to provide a flexible cable jumper device having heat resistance and low loss characteristics by using a material having heat resistant and a low-dielectric constant in a hybrid structure, and a method for manufacturing the same.

In addition, the object of the present invention is to facilitate the attachment and detachment of a plug and a receptacle so that LTCC can be mounted on an RF module board to be connected.

Technical Solution

The flexible cable jumper device according to one aspect of the present invention includes a cover layer; a heat resistant layer formed on the cover layer; a terminal layer formed on one side of the heat-resistant layer; and a plug formed on the terminal layer, and the plug is in contact with a receptacle attached to an electronic board by magnetic force of a magnetic member.

Here, the plug and the receptacle each have a hole, and the magnetic member is inserted into the hole and fixed.

In addition, the hole is formed to a depth of 50% or more of the thickness of the plug and the receptacle.

In addition, each of the plug and the receptacle has at least two holes.

In addition, the plug and the receptacle each have a hole, and the hole of the plug and the hole of the receptacle are into which the magnetic member is inserted, or the magnetic member and a metal member are inserted, so that the plug and the receptacle are in contact with each other by the magnetic force of the magnetic member or by the magnetic force of the magnetic member and the metal member.

In addition, one side of the plug and the receptacle each include a line-shaped groove.

In addition, each of the plug and the receptacle is a flat substrate or a curved substrate.

In addition, the flexible cable jumper device further includes between the cover layer and the heat resistant layer, a first metal layer stacked on the cover layer and having a circuit pattern formed thereon; a first dielectric layer stacked on the first metal layer; a first adhesive layer applied on the first dielectric layer; and a second metal layer stacked on the first dielectric layer to which the first adhesive layer is applied and having a circuit pattern formed thereon.

In addition, the flexible cable jumper device further includes a second dielectric layer stacked on the second metal layer; a third metal layer stacked on the second dielectric layer and having a circuit pattern formed thereon; and a second adhesive layer applied on the third metal layer, and the heat resistant layer is formed on the third metal layer to which the second adhesive layer is applied.

Here, the cover layer and the heat resistant layer are polyimide.

In addition, at least one of the first dielectric layer and the second dielectric layer includes polytetrafluoroethylene.

In addition, an irregularity is formed at least one of an upper surface and a lower surface of the second dielectric layer.

The method for manufacturing a flexible cable jumper device according to one aspect of the present invention includes the steps of: preparing a cover layer; forming a heat resistant layer on the cover layer; forming a terminal layer on one side of the heat resistant layer; and forming a plug on the terminal layer, and the magnetic force of a magnetic member is used to bring the plug into contact with a receptacle attached to an electronic board.

Here, the method further includes the steps of: stacking a metal on the cover layer and etching the stacked metal to form a first metal layer forming a circuit pattern, between the steps of preparing the cover layer and forming the heat resistant layer; stacking a first dielectric layer on the first metal layer; applying a first adhesive layer on the first dielectric layer; and stacking a metal on the first dielectric layer to which the first adhesive layer is applied, and etching the stacked metal to form a second metal layer forming a circuit pattern.

In addition, the method further includes the steps of: after forming the second metal layer, stacking a second dielectric layer on the second metal layer; stacking a metal on the second dielectric layer and etching the metal to form a circuit pattern to form a third metal layer; and stacking a second adhesive layer on the third metal layer.

In addition, the method further includes the step of forming an irregularity on an upper surface or a lower surface of the second dielectric before the step of stacking the second dielectric layer.

In addition, the method further includes any one or more steps of etching a surface of the first dielectric layer after stacking the first dielectric layer and etching a surface of the second dielectric layer after stacking the second dielectric layer.

Here, in the step of forming the heat resistant layer, the heat resistant layer is stacked by coating a polyimide film in a printing method.

In addition, the plug and the receptacle each include a hole, and the magnetic member is inserted into the hole and fixed.

In addition, the hole defines a depth of 50% or more of the thickness of the plug and the receptacle.

Advantageous Effects

The flexible cable jumper device according to the present invention exhibits excellent heat resistance and low loss by stacking a heat resistant material and a low dielectric material in a hybrid.

In addition, a plug and a receptacle can be attached and detached by magnetic force, and LTCC can be mounted on an RF module board, so that there are effects of miniaturization, process simplification and loss factor reduction.

DESCRIPTION OF DRAWINGS

FIG. 6 is a manufacturing process flowchart for explaining in more detail a manufacturing method of a flexible cable jumper structure.

MODE FOR INVENTION

In order to fully understand the present invention, the operational advantages of the present invention, and the objects achieved by the implementation of the present invention, reference should be made to the accompanying drawings illustrating preferred embodiments of the present invention and the contents described in the accompanying drawings.

In describing preferred embodiments of the present invention, well-known techniques or repetitive descriptions that may unnecessarily obscure the gist of the present invention will be reduced or omitted.

Figure 1:
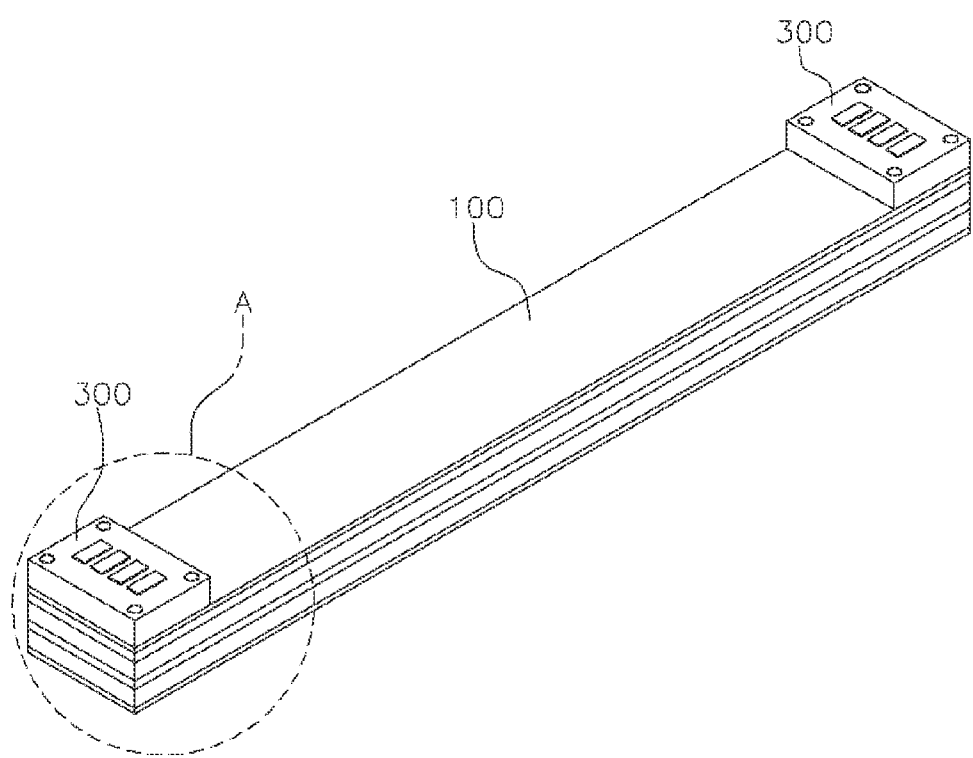
FIG. 1 is a view explaining the appearance of a flexible cable jumper device in which a plug is assembled to a flexible cable jumper structure according to an embodiment of the present invention.
Figure 2:
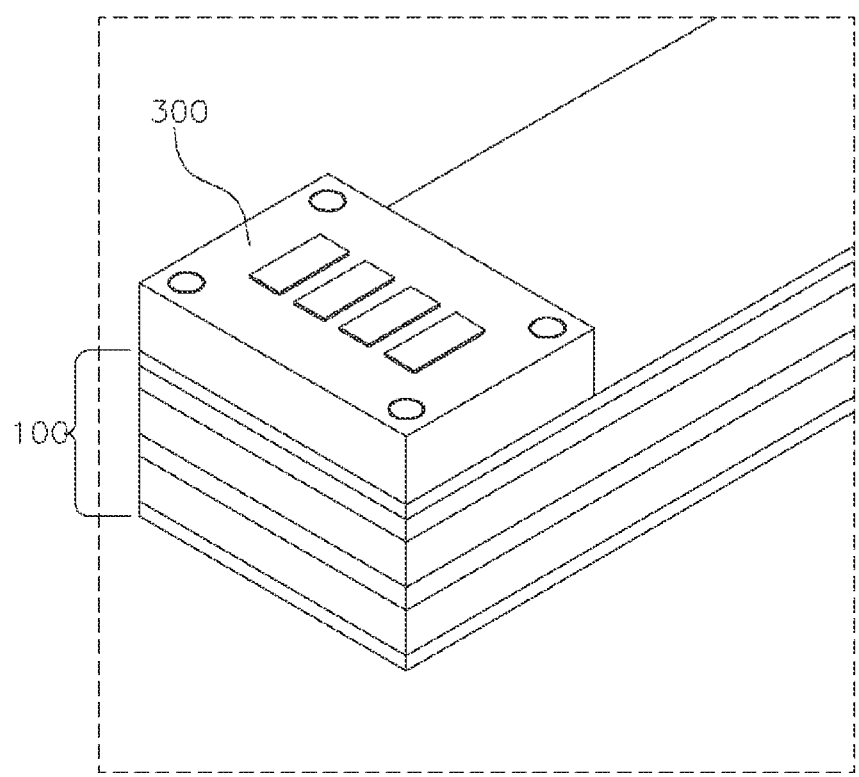
FIG. 2 is a view illustratively showing a cross section of area A shown in FIG. 1.
Figure 3:
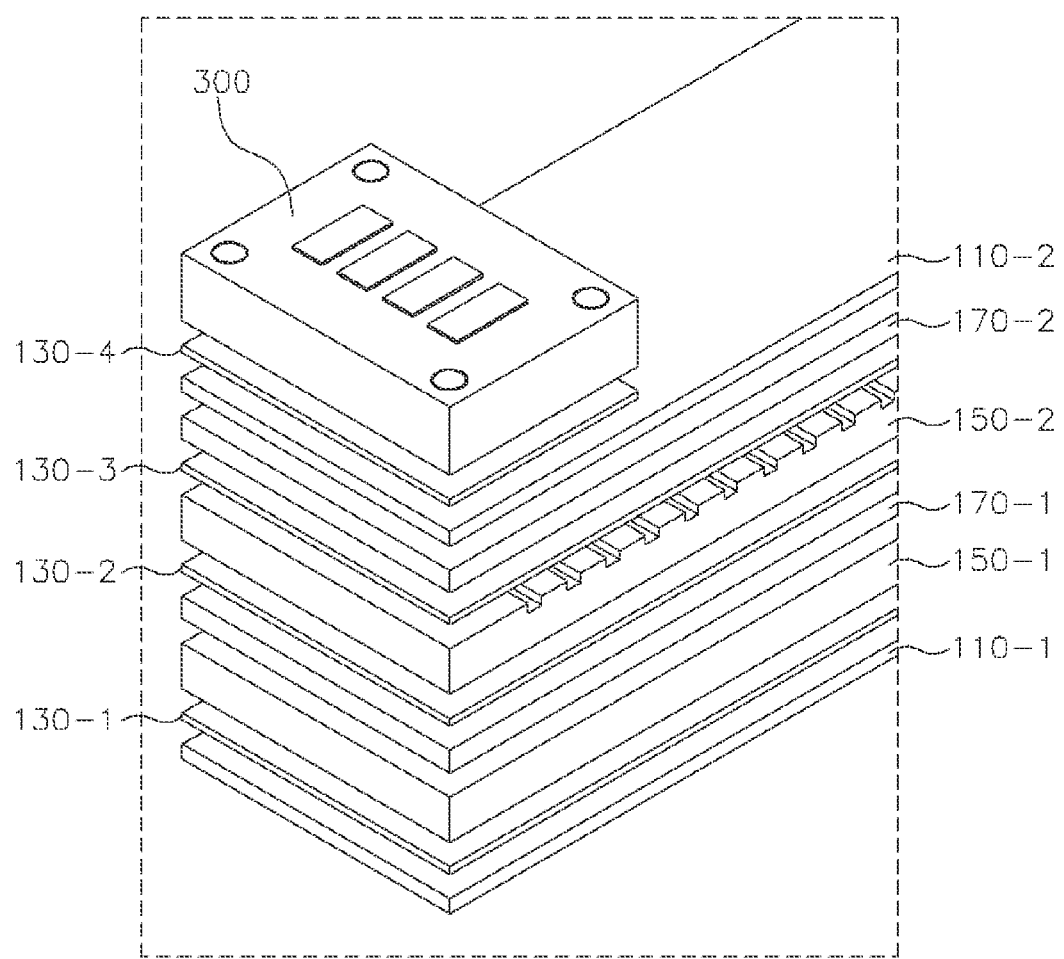
FIG. 3 is a view illustratively explaining the stacked structure of the flexible cable jumper structure in the area A shown in FIG. 1.

FIG. 1 is a flexible cable jumper device in which a plug is assembled to a flexible cable jumper structure according to an embodiment of the present invention, FIG. 2 shows a cross section of area A shown in FIG. 1, and FIG. 3 shows the stacked structure of the flexible cable jumper structure in the area A shown in FIG. 1.

Hereinafter, a flexible cable jumper device according to an embodiment of the present invention will be described with reference to FIGS. 1 to 3.

In an embodiment of the present invention, the flexible cable jumper device includes a flexible cable jumper structure 100 and an RF connector including a plug 300 and a receptacle 200.

The flexible cable jumper structure 100 is assembled and fastened with the plug 300 on both sides or one side thereof, and is electrically connected to other electronic devices via the RF connector composed of the plug 300 and the receptacle 200 (see FIG. 8) to be described later.

The flexible cable jumper structure 100 of the present invention can exhibit heat resistance and low loss characteristics by stacking a heat resistant material and a low dielectric material in a hybrid manner. The stacked structure of the flexible cable jumper structure 100 of the present invention will be described in more detail below. The flexible cable jumper structure shown in FIG. 1 includes the plug 300 installed on a terminal layer in a surface mount technology (SMT) method, and functions as an interface that electrically connects a board and a board, a board and a component by the connector having the plug 300 and the receptacle. Here, the plug is in contact with the receptacle attached to the electronic board by the magnetic force of a magnetic member, so that attachment and detachment can be easily performed.

The flexible cable jumper structure 100 shown in FIG. 1 has heat resistance and low loss characteristics, and thus may be used as a core material of the flexible cable jumper device. In order to exhibit such heat resistance and low loss characteristics, there is a characteristic in the stacking order and stacking method of a heat resistant material and a low loss material. The stacked structure of the flexible cable jumper structure 100 will be separately described below with reference to FIGS. 2 and 3, which are the enlarged views of the area A shown in FIG. 1.

Referring to FIG. 2, the flexible cable jumper structure 100 is composed of a multi-layer constituted of a metal layer, a dielectric layer, an adhesive layer, and the like sequentially from a lower cover layer, which becomes a base layer, and the flexible cable jumper structure 100 of the present invention has technical characteristics in the thickness of each layer constituting the multi-layer, a surface processing method, the material of each layer, and the stacking order of the layers.

The material, thickness, stacking order, surface processing method, and the like of each layer of the flexible cable jumper structure 100, which is a core component of the flexible cable jumper device of the present invention, will be described below with reference to separate drawings.

Referring to FIG. 3, a cover layer 110-1 may be positioned on the lowermost layer of the flexible cable jumper structure 100. In FIG. 3, the cover layer 110-1 may be a base layer. The cover layer 110-1 may be formed of a heat resistant material, preferably polyimide. The thickness of the cover layer 110-1 may be 25 μm to 40 μm, and preferably, a thickness of 30 μm to 35 μm may be used. Since the cover layer 110-1 is a material having good heat resistance, basic properties can be maintained without physical or chemical change even at a process temperature of 240° C. to 260° C.

A first metal layer 130-1 having a predetermined circuit pattern may be positioned on the cover layer 110-1. The first metal layer 130-1 may be electrically connected to the plug 300, which will be described later. The first metal layer 130-1 may be made of any one or two or more alloys selected from copper, gold, platinum, and silver having excellent electrical conductivity.

Various methods may be used for the structure and method of electrical connection between the first metal layer 130-1 and the plug 300. For example, an electrical path between the first metal layer 130-1 and a terminal layer may be formed by a via hole method, or an electrical connection may be formed by an interface terminal with the plug 300. Since this method has little relevance to understanding the technical idea of the present invention, a detailed description thereof will be omitted. However, it is apparent that a generally known electrical connection method between a plug and a multi-layer metal layer can be applied.

A first dielectric layer 150-1 may be stacked on the first metal layer 130-1 using a low dielectric material. The first dielectric layer 150-1 uses a low dielectric material, and may preferably use polytetrafluoroethylene and other materials having similar physical properties.

The following Chemical Formula I represents the chemical structure of polytetrafluoroethylene (PTFE).

[Chemical Formula 1]

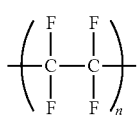

Polytetrafluoroethylene consists of large molecules prepared by chemically bonding many small molecules (units) in the form of chains or networks.

Polytetrafluoroethylene is a non-flammable fluororesin belonging to the class of organic polymers. Polytetrafluoroethylene shows excellent electrical properties such as extremely low dielectric loss, high insulation, breakdown voltage, and the like. In particular, polytetrafluoroethylene shows minimum values in both dielectric constant and dielectric loss factor, while maintaining stability over a wide range of temperatures and frequencies due to extremely high volume resistivity, so it can be used as an insulating material. Polytetrafluoroethylene has a dielectric constant of 2.1 at 1 MHz. The thickness of the first dielectric layer 150-1 may be 100 μm to 150 μm, and preferably 110 μm to 140 μm. Polytetrafluoroethylene may be used by forming roughness on the surface through a chemical etching process on the upper or lower surface thereof in order to increase adhesion.

Then, a first adhesive layer 170-1 may be applied on the first dielectric layer 150-1. The first adhesive layer 170-1 may be applied to a thickness of 30 μm to 70 μm, and preferably may be applied to a thickness of 40 m to 60 μm.

A second metal layer 130-2 may be stacked on the surface on which the first adhesive layer 170-1 is applied. The second metal layer 130-2 may be processed into a predetermined circuit pattern and provide electrical paths on both sides of the flexible cable jumper structure. The second metal layer 130-2 may be made of any one or two or more alloys selected from copper, gold, platinum, and silver having excellent electrical conductivity.

A second dielectric layer 150-2 may be stacked on the second metal layer 130-2. As described above, the second dielectric layer 150-2 may be formed of a material having the same material and thickness as the first dielectric layer 150-1 and having a low dielectric constant. For example, polytetrafluoroethylene can be used.

On the other hand, a contact force between the second metal layer 130-2 and the third metal layer 130-3 can be increased without using a separate contact agent by providing an irregularity structure on one or both surfaces of the upper and lower surfaces of the second dielectric layer 150-2. For a more detailed description, reference is made to FIG. 4.

Figure 4:
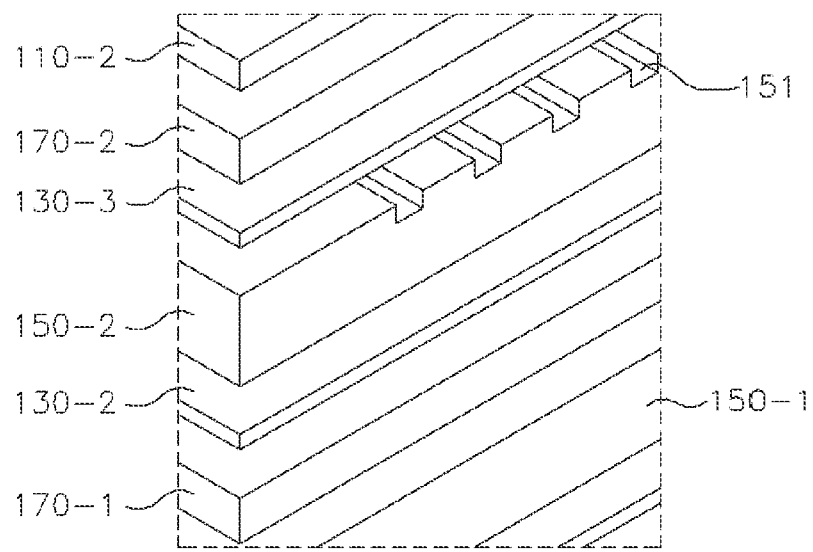
FIG. 4 is a view illustratively explaining an irregularity structure provided on an upper surface of a second dielectric layer between the second metal layer and the third metal layer shown in FIG. 1.

FIG. 4 is a view illustratively showing an irregularity structure provided on an upper surface of a second dielectric layer between the second metal layer and the third metal layer shown in FIG. 1. Referring to FIG. 4, a plurality of irregularities 151 may be formed on the upper surface of the second dielectric layer 150-2. The shape, size, and dimension of the irregularity may vary depending on the thickness, width, and length of the second dielectric layer 150-2. In addition to the upper surface of the second dielectric layer 150-2, irregularities may be provided on the lower surface, and some or all of the upper surface or the lower surface may have irregularities. By providing the irregularity structure on the upper and lower surfaces of the second dielectric layer 150-2, the contact force between the second metal layer 130-2 and the third metal layer 130-3 and the second dielectric layer 150-2 may be increased.

Also, referring to FIG. 3, the third metal layer 130-3 may be formed on the second dielectric layer 150-2. The third metal layer 130-3 may have a circuit pattern having a predetermined shape and provide electrical paths on both sides of the flexible cable jumper device.

A second adhesive layer 170-2 may be applied on the third metal layer 130-3. The thickness of the second adhesive layer 170-2 may be applied to a thickness of 30 μm to 70 μm, and preferably 40 μm to 60 μm. The third metal layer 130-3 may be made of any one or two or more alloys selected from copper, gold, platinum, and silver having excellent electrical conductivity.

A heat resistant layer 110-2, which is a heat resistant material, may be stacked on the second adhesive layer 170-2. Here, as the heat resistant layer 110-2, a material having excellent heat resistance characteristics may be used, and polyimide may be preferably used. The thickness of the heat resistant layer 110-2 may be 25 μm to 40 μm, preferably 30 μm to 35 μm. Since the heat resistant layer 110-2 is a material having excellent heat resistance, basic properties can be maintained without physical and chemical changes even at a process temperature of 240° C. to 260° C. By finishing the upper surface with the heat resistant layer 110-2, it is possible to have an effect of preventing thermal deformation even during the process of forming the plug 300 by applying SMT.

That is, the present invention can significantly reduce the occurrence of damages after the SMT process and prevent thermal deformation from occurring even after a reflow process by using polyimide, which is a heat resistant material, as the cover layer 110-1 and the heat resistant layer 110-2, which are heat resistant materials.

In addition, since the first dielectric layer 150-1, which is a low dielectric material, is provided between the first metal layer 130-1 and the second metal layer 130-2, and the second dielectric layer 150-2 is provided between the second metal layer 130-2 and the third metal layer 130-3, an effect of low loss can be achieved.

Also, a terminal layer 130-4 may be formed to electrically connect the heat resistant layer 110-2 and the plug 300. The terminal layer 130-4 may be formed in one region of both sides or one side of the uppermost surface of the flexible jumper structure. The terminal layer 130-4 may be made of any one or two or more alloys selected from copper, gold, platinum, and silver having excellent electrical conductivity.

Here, in the step of stacking the heat resistant layer, the heat resistant layer may be stacked on the second metal layer by heating and pressing the polyimide film in a hot press method under the interposition of an adhesive layer.

The manufacturing method of the flexible cable jumper device may be performed by assembling the plug to the terminal part by the SMT method after completing the flexible cable jumper structure. In order to connect the plug to the flexible cable jumper structure, the SMT method may be used, but the present invention is not limited thereto. Hereinafter, the method of manufacturing the flexible cable jumper structure will be described in detail.

Figure 5:
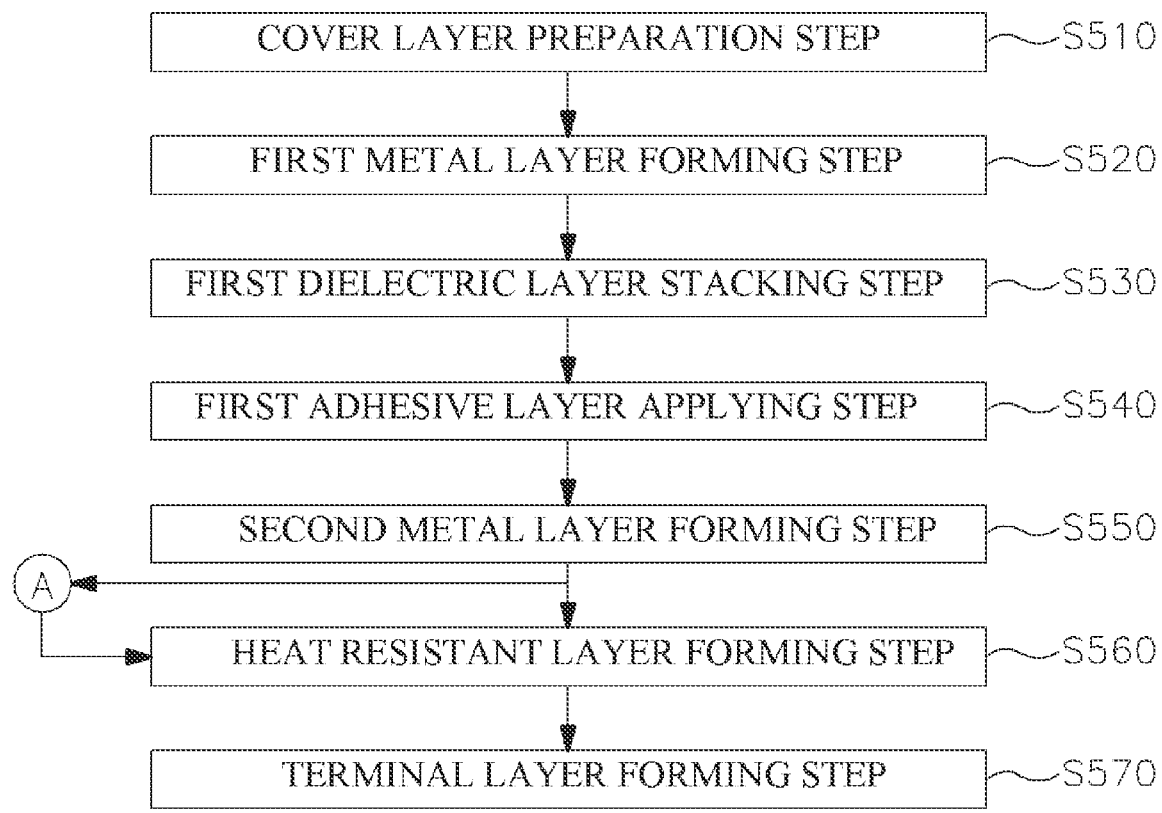
FIG. 5 is a manufacturing process flowchart for illustratively explaining a manufacturing method of a flexible cable jumper structure of the present invention.

FIG. 5 is a manufacturing process flowchart for illustratively explaining the manufacturing method of the flexible cable jumper structure of the present invention. Referring to FIG. 5, the step of preparing the cover layer may be performed (S510). The cover layer may be prepared by forming a polyimide film having a thickness of 25 µm to 40 µm on a base substrate. It is preferable to prepare the cover layer by a printing method rather than a spray method.

A metal may be stacked on the cover layer to a thickness of 1 µm to 10 µm, and a first metal layer may be formed by etching the metal to form a predetermined circuit pattern (S520).

A first dielectric layer is stacked on the first metal layer, and the stacking thickness may be 100 µm to 150 µm, and preferably 110 µm to 140 µm (S530). Polytetrafluoroethylene may be used for the first dielectric layer, and the polytetrafluoroethylene produced by casting or cutting may be used. The first dielectric layer may be used by forming roughness on the surface of the first dielectric layer through a chemical etching process on the upper or lower surface in order to increase adhesion. This may be etched before stacking the first dielectric layer, or may be etched after stacking the first dielectric layer. If etching is performed after stacking the dielectric layer, there is an advantage in that the process is simplified.

An adhesive may be applied on the first dielectric layer to apply a first adhesive layer (S540). Here, the thickness of the adhesive may be 30 µm to 70 µm, preferably 40 µm to 60 µm.

A second metal layer may be formed by stacking a metal on the surface on which the first adhesive layer is applied, and etching the metal to form a predetermined circuit pattern (S550). In this case, as the second metal layer, a metal having excellent conductivity, such as any one or two or more alloys selected from copper, gold, silver, and platinum, and having a thickness of 1 µm to 10 µm may be used.

Also, after forming the second metal layer, the step of forming the heat resistant layer may be performed (S560). According to another embodiment, step A may be performed after forming the second metal layer.

Referring to FIG. 6 with respect to process step A, a step of stacking a second dielectric layer on the second metal layer may be performed (S550-1). The stacking thickness may be 100 µm to 150 µm, and preferably, 110 µm to 140 µm. For the second dielectric layer, polytetrafluoroethylene may be used, and the polytetrafluoroethylene produced by casting or cutting may be used. In addition, the step of forming irregularities on the upper surface or the lower surface of the second dielectric layer may be additionally performed. Etching may be performed before stacking the second dielectric layer, or after stacking the second dielectric layer. If etching is performed after stacking the dielectric layer, there is an advantage in that the process is simplified.

A third metal layer may be formed by stacking a metal on the second dielectric layer and etching the metal to form a predetermined circuit pattern (S550-2). In this case, as the third metal layer, a metal having excellent conductivity such as any one or two or more alloys selected from copper, gold, silver, and platinum, and having a thickness of 1 µm to 10 µm may be used.

The second adhesive layer may be applied by applying an adhesive on the third metal layer (S550-3). Here, the thickness of the adhesive may be 30 µm to 70 µm, and preferably 40 µm to 60 µm. After the second adhesive layer is applied, the heat resistant layer forming step (S560) may be performed.

The step of forming a heat resistant layer on the third metal layer to which the second adhesive layer is applied may be performed (S560). In the embodiment in which step A is not performed, after forming the second metal layer, a process of applying an adhesive may be additionally performed before the step (S560) of forming the heat resistant layer. The heat resistant layer is for heat resistant characteristics, and a polyimide film having a thickness of 25 µm to 40 µm can be coated to form the heat resistant layer.

A metal may be stacked on the heat resistant layer, and the terminal layer for electrically connecting to the plug may be formed (S570). In this case, the terminal layer may be formed of a metal having excellent conductivity such as any one or two or more alloys selected from copper, gold, silver, and platinum, and having a thickness of 1 µm to 10 µm.

The flexible cable jumper structure 100 is manufactured by such a process, and the plug 300 having a magnetic member is coupled thereto to manufacture a flexible cable jumper device.

Figure 7B:
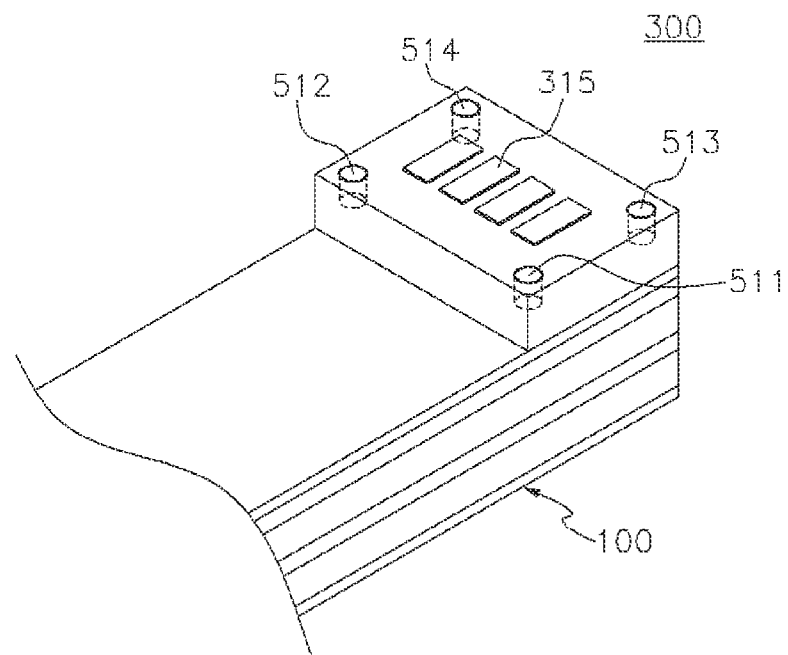
FIG. 7 shows a receptacle for an RF connector and a plug for an RF connector attached to a flexible cable jumper structure of the present invention.

As shown in FIG. 7, the RF connector includes the receptacle 200 shown in (a) of FIG. 7 and the plug 300 shown in (b) of FIG. 7. An electrode 215 is provided on one upper side of the receptacle 200, and an electrode 315 is provided on one upper side of the plug 300. In addition, in order for the electrode 315 of the plug 300 to contact the electrode 215 of the receptacle 200, the magnetic members 411, 412, 413, 414 of the receptacle 200 have structures to be in contact with the magnetic members 511, 512, 513 and 514 of the plug 300 by a magnetic force.

By making the side with the electrode 215 of the receptacle 200 and the side with the electrode 315 on the plug 300 face each other, the magnetic member 411 of the receptacle 200 may be connected with the magnetic member 513 of the plug 300, the magnetic member 412 of the receptacle 200 may be connected with the magnetic member 514 of the plug 300, and the magnetic member 413 of the receptacle 200 may be connected with the magnetic member 512 of the plug 300, and the magnetic member 414 of the receptacle 200 may be connected to the magnetic member 511 of the plug 300, respectively.

The structure connected by the magnetic force may mean connecting the N pole and the S pole, and may mean connecting a magnet and a metal. For example, a magnetic member or a metal member may be inserted into the hole of the plug and the hole of the receptacle so that the magnetic members may contact each other or the magnetic member and the metal member may contact each other.

The electrode 215 of the receptacle 200 and the electrode 315 of the plug 300 may be formed in a single layer or in multiple layers. As the material of the electrode layer, any one selected from copper (Cu), silver (Ag), aluminum (Al), nickel (Ni), tin (Sn), and molybdenum (Mo) may be used, and alloys thereof or a mixture of other metals may also be used. For example, alloys such as TiCu, NiTi, TiCu, NiNb, CuMo, TiAg and the like may be used. Since the ceramic material of the receptacle 200 and the plug 300 are easily broken when attached to each other, a multi-layered metal layer may be preferably used as the electrode 215 of the receptacle 200 and the electrode 315 of the plug 300. For example, a multi-layer layer in which an Ag electrode layer, an Ni electrode layer, and an Au electrode layer are sequentially stacked may be used.

When the electrode 215 of the receptacle 200 and the electrode 315 of the plug 300 form a multilayer layer, the Ag electrode layer is preferably 5 to 15 µm, the Ni electrode layer is preferably 3 to 10 µm, and the Au electrode layer is preferably 0.01 to 0.5 µm. In addition, when the thickness of the multilayer layer of the Ag electrode layer, the Ni electrode layer, and the Au electrode layer is 10 to 20 µm, sufficient conductivity can be obtained, and the effect as a buffer layer can also be obtained.

Also, although not shown, an EMI/ESD may be embedded inside the receptacle 200. Accordingly, there is no need to separately install EMI/ESD, the process is simplified, and the device can be miniaturized.

A lower portion of the plug 300 may be connected to the flex cable jumper structure 100. The receptacle 200 and the plug 300 may use LTCC. Accordingly, there is an advantage of obtaining an RF connector with a reduced loss factor in the RF module in the frequency range of 3.5 G to 28 G of 5 G.

Figure 8:
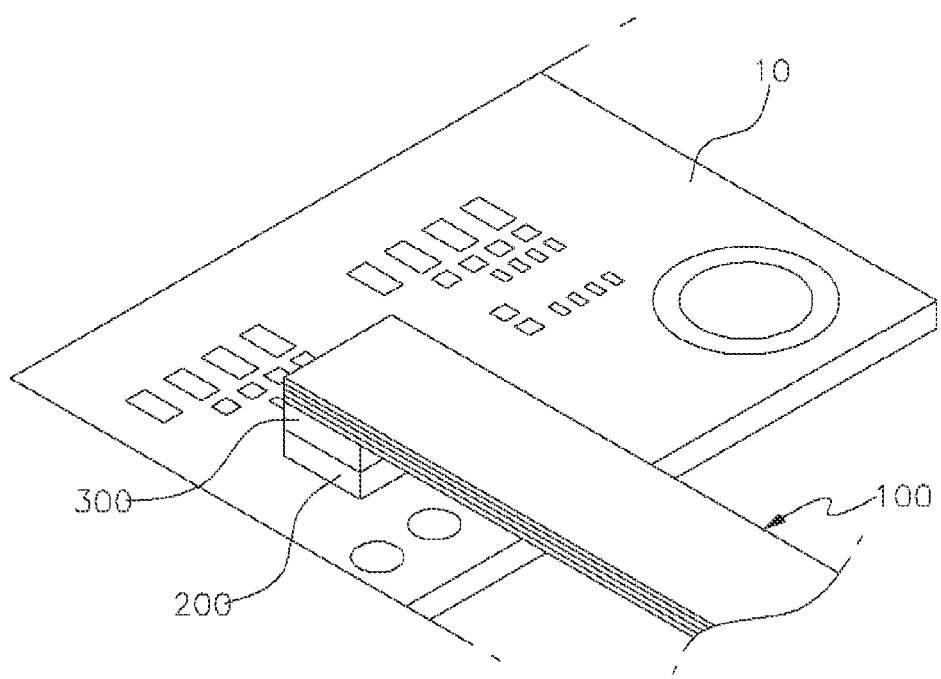
FIG. 8 shows a PCB on which an RF connector attached to a flexible cable jumper structure of the present invention is mounted.

FIG. 8 shows a view in which an RF connector is mounted on a PCB.

The receptacle 200 of the flexible cable jumper structure is in contact with the plug 300 of the upper part of the PCB 10 by the magnetic force of the magnetic member, so that the flexible cable jumper structure can be easily attached to and detached from the PCB.

A conventional adhesive member may be used to mount the receptacle 200 on the PCB 10. For example, it may be fixed using an organic adhesive member such as an epoxy resin and the like, or may be fixed using a metal adhesive member such as soldering, but the present invention is not limited thereto.

Although not shown in FIG. 8, a method in which a magnetic member is provided under the receptacle 200 and a magnetic member is provided on the PCB 10, and the receptacle 200 and the PCB 10 are detached and attached by the magnetic force of the magnetic member can also be used.

Next, the number and shape of the holes for inserting the magnetic member into the receptacle or the plug will be described. The hole into which the magnetic member is inserted may be provided with two or more in each of the receptacle and the plug. For example, (a) of FIG. 9 shows the receptacle 200 having four holes, and (b) of FIG. 9 shows the receptacle 200A having two holes.

Figure 9A:
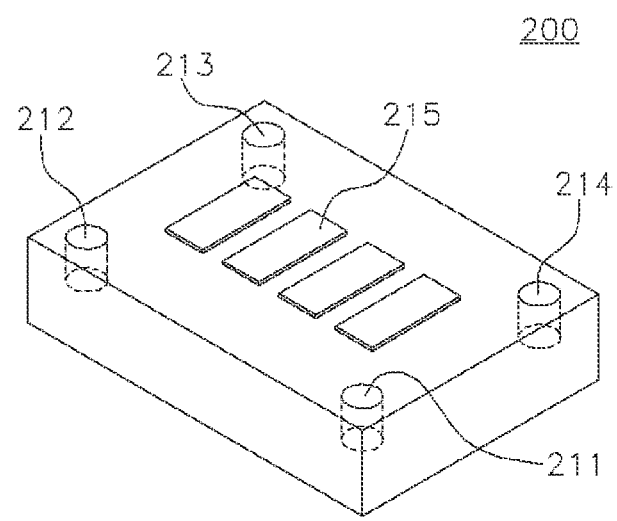
FIG. 9 shows an embodiment of a receptacle for an RF connector attached to a flexible cable jumper structure of the present invention.
Figure 9B:
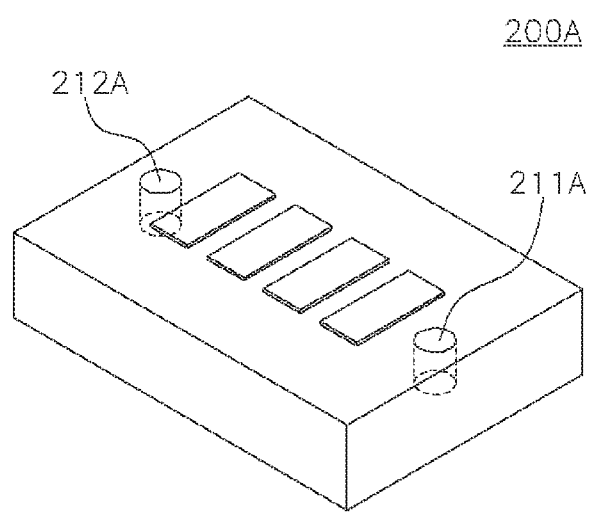

As shown in (a) of FIG. 9, the receptacle 200 may have four holes 211, 212, 213, and 214. In order to stably attach the receptacle and the plug, it is preferable that holes are provided in the corners of the receptacle and the plug, respectively. The shape of the hole may be a circle or an ellipse, and may be a polygon, such as a triangle, a square, a pentagon, and the like, but is not limited thereto as long as the magnetic member can be inserted into the hole.

As shown in (b) of FIG. 9, the receptacle 200A may have two holes 211A and 212A. Here, the plug (not shown) corresponding to the receptacle 200A has two holes, so that the electrode provided on one side of the plug and the electrode provided on one side of the receptacle 200A can be in contact with each other by the magnetic force of the magnetic member.

Next, the depth of the hole perforated in the receptacle and the plug will be described. A hole having a certain depth may be provided in the receptacle and the plug to secure the magnetic member to the receptacle and the plug. As for the depth of the hole, it is sufficient that the magnetic member can be stably fixed to the receptacle and the plug, and 25% or more of the thickness of each of the receptacle and the plug may be used, and preferably 50% or more of the thickness of each of the receptacle and the plug may be used. More preferably, 75% or more of the thickness of each of the receptacle and the plug may be used.

Figure 10A:
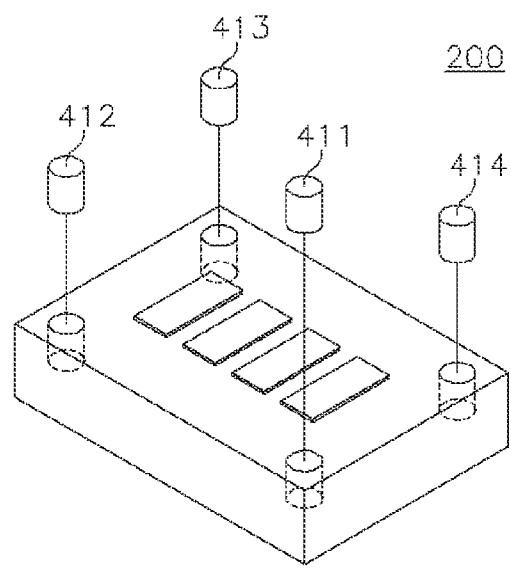
FIGS. 10 to 12 each show another embodiment of a receptacle for an RF connector attached to a flexible cable jumper structure of the present invention.
Figure 10B:
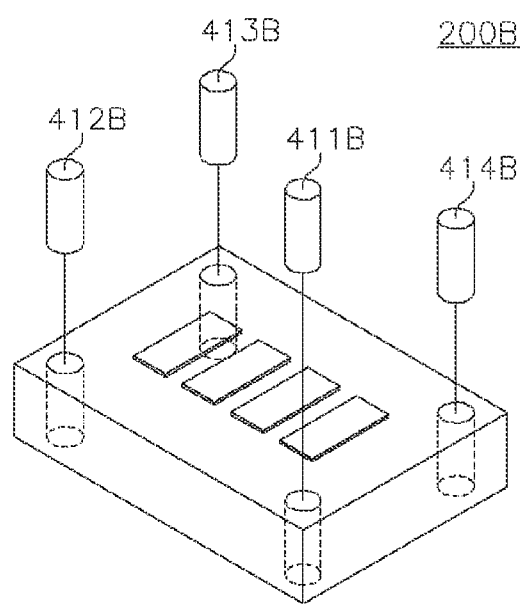

As shown in (a) of FIG. 9 and FIG. 10, the receptacle 200 has holes 211, 212, 213, 214 in which magnetic members 411, 412, 413, 414 are inserted, and the holes 211, 212, 213 and 214 may be perforated to 50% of the thickness of the receptacle 200.

As shown in (b) of FIG. 10, the receptacle 200B has holes 211B, 212B, 213B, and 214B in which the magnetic members 411B, 412B, 413B, and 414B are inserted, and the holes 211B, 212B, 213B, 214B may be perforated to 100% of the thickness of the receptacle 200B. When the entire thickness of the receptacle 200B is perforated, the fixability of the magnetic member is good and the insertion can be performed from the rear or front of the receptacle, thereby making workability easier.

It is not necessary to provide special attachment means for fixing the magnetic member in the hole of the receptacle and the plug. That is, the diameter of the hole of each of the receptacle and the plug may be designed to be equal to or slightly larger than the diameter of the magnetic member to be inserted and fixed. For example, if the diameter of the hole of each of the receptacle and the plug is designed to be 0.1% to 3% larger than the diameter of the magnetic member to be inserted and then the magnetic member is inserted into the holes of the receptacle and the plug, the magnetic member may be physically fixed in the holes of the receptacle and the plug due to the friction force between the hole and the magnetic member.

Alternatively, when the magnetic member is inserted into the holes of the receptacle and the plug, a large amount of stress is applied to the receptacle and the plug to cause breakage since the receptacle and the plug are ceramic. Thus, the diameters of the holes of the receptacle and the plug are designed to be larger than the diameter of the magnetic member to be inserted and fixed. For example, the diameters of the holes of the receptacle and the plug may be 3% to 20% larger than the diameter of the magnetic member to be inserted, and an organic adhesive such as epoxy or silicone rubber may be used to fix the magnetic member to the holes of the receptacle and the plug. Here, silicone rubber is more preferable than epoxy in terms of relieving the impact at the time of attaching and detaching the receptacle and the plug.

Next, the structure of the hole perforated in the receptacle and the plug will be described.

Figure 11A:
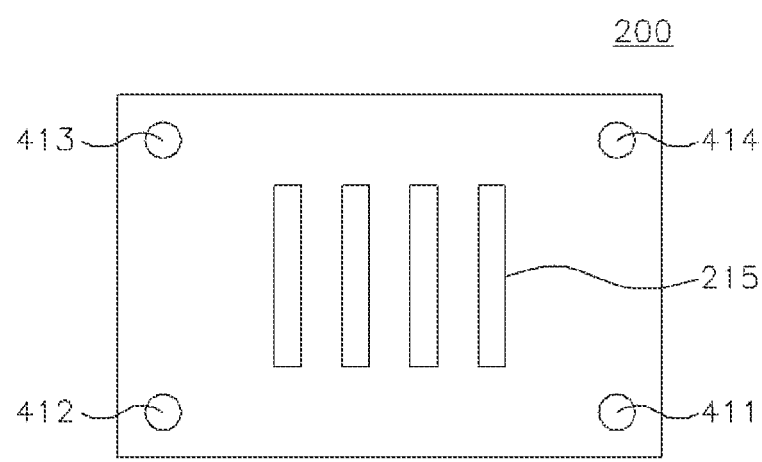
Figure 11B:
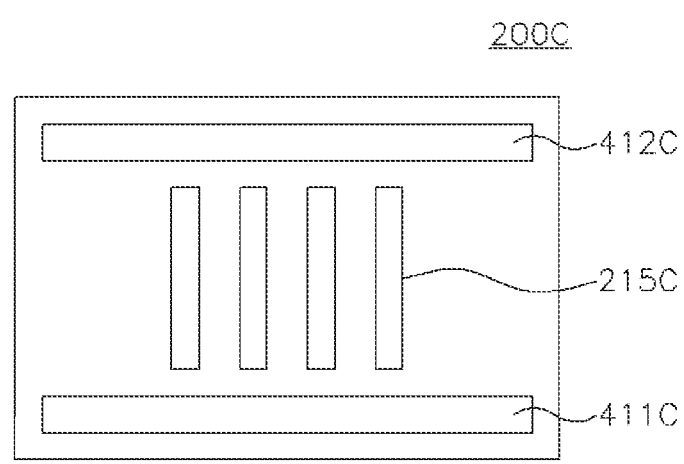

As shown in (a) of FIG. 11, the receptacle 200 may include circular magnetic members 411, 412, 413, and 414. In addition, as shown in (b) of FIG. 11, as another form for contacting the electrode provided on one side of the plug and the electrode provided on one side of the receptacle by the magnetic force of the magnetic member, a receptacle 200C has a line-shaped groove and line-shaped magnetic members 411C and 412C may be fixed into the groove. A plug (not shown) corresponding to the receptacle 200C is also provided with the line-shaped groove, and the line-shaped magnetic member is fixed to the groove, so that the magnetic members 411C and 412C of the receptacle 200C and the magnetic member of the plug can be magnetically connected. When the line-shaped magnetic members 411C and 412C are used, the contact area between the magnetic members is increased, compared to when the circular magnetic members 411, 412, 413, and 414 are used, thereby increasing the adhesion force between the receptacle and the plug.

Next, the substrate shapes of the receptacle and the plug will be described.

Figure 12A:
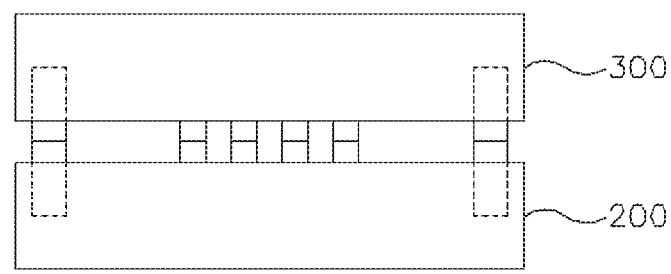
Figure 12B:
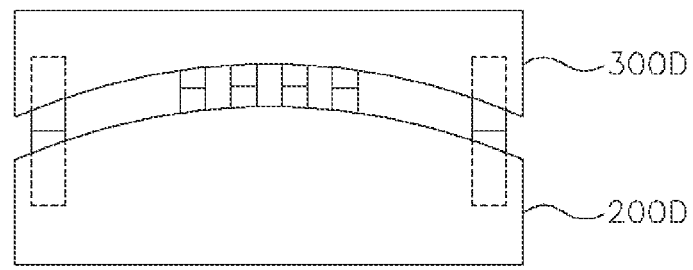
Figure 12C:
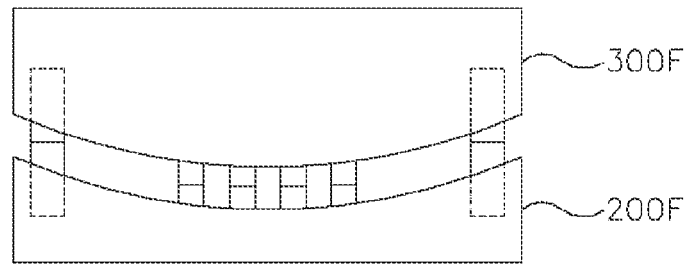

As shown in (a) of FIG. 12, a flat substrate may be used as the receptacle 200 and the plug 300. Alternatively, a curved substrate may be used as the receptacle and the plug.

For example, as shown in (b) of FIG. 12, a cross-section of the electrode-equipped surface of the plug 300D may be concave and a cross-section of the electrode-equipped surface of the receptacle 200D may be convex. Also, as shown in (c) of FIG. 12, a cross-section of the electrode-equipped surface of the plug 300F may be convex and a cross-section of the electrode-equipped surface of the receptacle 200F may be convex. There is an advantage in that alignment errors can be reduced by using the curved substrate as the receptacle and the plug.

The present invention as described above has been described with reference to the illustrated drawings, but it is not limited to the described embodiments, and it is apparent to those skilled in the art that various modifications and variations can be made without departing from the spirit and scope of the present invention. Accordingly, such modifications or variations should be said to belong to the claims of the present invention, and the scope of the present invention should be interpreted based on the appended claims.

EXPLANATION OF REFERENCED NUMERALS

100: flexible cable jumper structure
110-1, 110-2: cover layer, heat resistant layer
130-1, 130-2, 130-3: first metal layer, second metal layer, third metal layer
150-1, 150-2: first dielectric layer, second dielectric layer
170-1, 170-2: first adhesive layer, second adhesive layer
200: receptacle
300: plug

The invention claimed is:

1. A flexible cable jumper device includes a plug, a receptacle configured to attach to an electronic board, the flexible cable jumper device comprising:
   a cover layer;
   a heat resistant layer coupled on a surface of the cover layer;
   a terminal layer of at least one metal layer coupled on a surface of one side of the heat-resistant layer; and
   one surface of the plug directly coupled to a surface of the terminal layer and electrically connected to the terminal layer,
   wherein other surface of the plug electrically connected to a surface of the receptacle by magnetic force of a magnetic number,
   wherein the plug and the receptacle each have a plurality of magnet insertion holes, said holes includes the magnetic member fixedly inserted therein.

2. The flexible cable jumper device according to claim 1, wherein each of the plug and the receptacle has at least two holes, and the holes have a depth of 50% or more of a thickness of the plug and the receptacle.

3. The flexible cable jumper device according to claim 1, wherein one side of the plug and the receptacle each include a line-shaped groove, and the magnetic member is fixed into the line-shaped groove.

4. The flexible cable jumper device according to claim 1, wherein each of the plug and the receptacle is a flat substrate or a curved substrate.

5. The flexible cable jumper device according to claim 1, further comprising:
   a first metal layer stacked on the cover layer and having a circuit pattern formed thereon;
   a first dielectric layer stacked on the first metal layer;
   a first adhesive layer applied on the first dielectric layer; and
   a second metal layer stacked on the first dielectric layer to which the first adhesive layer is applied and having a circuit pattern formed thereon.

6. The flexible cable jumper device according to claim 5, further comprising:
   a second dielectric layer stacked on the second metal layer;
   a third metal layer stacked on the second dielectric layer and having a circuit pattern formed thereon; and
   a second adhesive layer applied on the third metal layer,
   wherein the heat resistant layer is formed on the third metal layer to which the second adhesive layer is applied, and at least one of the first dielectric layer and the second dielectric layer includes polytetrafluoroethylene.

7. The flexible cable jumper device according to claim 6, wherein an irregularity is coupled on at least one of an upper surface and a lower surface of the second dielectric layer.

8. The flexible cable jumper device according to claim 1, wherein the cover layer and the heat resistant layer are polyimide.

* * * * *